United States Patent [19]

Eerkes et al.

[11] Patent Number: 4,996,115
[45] Date of Patent: Feb. 26, 1991

[54] COMPOSITE STRUCTURE

[75] Inventors: Thijs Eerkes, Oakville; Carlos M. Diaz, Mississauga; James A. E. Bell, Oakville, all of Canada

[73] Assignee: Inco Limited, Toronto, Canada

[21] Appl. No.: 502,990

[22] Filed: Apr. 2, 1990

Related U.S. Application Data

[63] Continuation-in-part of Ser. No. 462,624, Dec. 20, 1989, abandoned.

[30] Foreign Application Priority Data

Dec. 23, 1988 [CA] Canada .................................. 587036

[51] Int. Cl.$^5$ ........................ B32B 3/24; B32B 15/20
[52] U.S. Cl. .................................. 428/614; 428/676; 428/931
[58] Field of Search ............... 428/614, 675, 676, 931, 428/620, 615

[56] References Cited

U.S. PATENT DOCUMENTS

| | | | |
|---|---|---|---|
| 3,175,893 | 3/1965 | Meretsky | 29/197 |
| 3,368,122 | 2/1968 | Fishman et al. | 357/56 |
| 3,399,332 | 8/1968 | Savolainen | 428/614 |
| 3,480,842 | 11/1969 | Scharli | 357/71 |
| 4,025,997 | 5/1977 | Geritis et al. | 428/663 |
| 4,196,442 | 4/1980 | Kuniya et al. | 357/81 |
| 4,211,354 | 7/1980 | Hoffman et al. | 228/118 |
| 4,256,792 | 3/1981 | Koepke et al. | 357/81 |
| 4,283,464 | 8/1981 | Hascoe | 428/594 |
| 4,401,728 | 8/1983 | Larker | 428/614 |
| 4,427,993 | 1/1984 | Fichot et al. | 357/81 |
| 4,482,912 | 11/1984 | Chiba et al. | 357/81 |
| 4,521,801 | 6/1985 | Kato et al. | 357/81 |

OTHER PUBLICATIONS

Lyman, Jerry, "Military Moves Headlong Into Surface Mounting", Electronics, Jul. 10, 1986, McGraw-Hill Inc. Reprint.

Horton, G. L., "Implementation of Surface Mount Technology in High Reliability Products", presented at the National Electronic Packaging and Production Conference, Feb. 1987.

M. A. Hunter, "Low Expansion Alloys", Metals Handbook, 8th ed., vol. 1, 1973, pp. 816–819.

Primary Examiner—John J. Zimmerman
Attorney, Agent, or Firm—Francis J. Mulligan, Jr.; Edward A. Steen

[57] ABSTRACT

A composite structure and a method of producing said composite structure from a combination of copper and a low coefficient of thermal expansion nickel-iron alloy is disclosed wherein the copper clads the nickel-iron sheet and is interposed through the central nickel-iron sheet in such a fashion as to provide a substantially isotropic heat transfer path.

4 Claims, 2 Drawing Sheets

COMPOSITE STRUCTURE

This application is a continuation-in-part of Ser. No. 462,624, filed Dec. 20, 1989, now abandoned.

BACKGROUND OF INVENTION

The proliferation of new integrated circuit chip technologies in electronic devices has changed the requirements of printed circuit substrates in the electronics industry. In particular, the use of leadless ceramic chip carriers results in 3 to 9 times higher packing density of operating components and the consequently more severe thermal management problems than have existed previously. Leadless ceramic chip carriers are designed to be surface mounted. Solder connecting the device to the printed circuit board is both an electrical and a mechanical connection. When these chip carriers are mounted on conventional circuit boards such as constructed of epoxy glass composites, the mismatch in thermal expansion coefficients of the chip carrier and the board is significant. The chip carrier has a linear thermal coefficient of expansion (CTE) of about 6.4 ppm/°C. over the temperature range of $-55°$ C. to $200°$ C. while the epoxy glass has a CTE of about 16 ppm/°C. over the same temperature range. This high mismatch results in solder-joint stress failure during thermal cycling.

Moreover, the higher packing density achievable with chip carriers generates more heat per unit area of printed circuit board than has been encountered heretofor. This heat must be dissipated to prevent high temperature failures in the devices. Conventional epoxy glass printed circuit board materials are thermal insulators and are not suitable in high packing density applications without separate provision for heat dissipation.

Several attempts to solve the problem have been made. Workers in the art have used a copper/iron-nickel alloy/copper sandwich construction as described in "Implementation of Surface Mount Technology in High Reliability Products", G.L. Horton, presented at National Electronic Packaging and Production Conference, NEPCON WEST, February 1987, Anaheim Convention Center, Anaheim, CA and in "Military Moves Headlong Into Surface Mounting", Special Report by Jerry Lyman, Electronics, July 10, 1986. In this configuration the CTE of the composite sandwich construction can be made to match the CTE of the leadless ceramic chip carrier, i.e. around 6.4 ppm/°C. The iron-nickel alloy (Invar, also sold as NILO TM 36 by Inco Alloys International, Inc.) in the center of the sandwich has a CTE of 1.6 ppm/°C. over the temperature range of $-18°$ C. to $175°$ C. (unless otherwise stated thermal expansions mentioned hereinafter and in the claims are over this range of temperature).

However, this sandwich construction has one major drawback. While the copper has an excellent thermal conductivity of about 400 Watts per meter degree Kelvin (W/m °K.) the Invar has a thermal conductivity of only around 9.6 W/m °K. This means that while the thermal conductivity along the strip is good, the conductivity through the strip is very poor. Thus, the sandwich construction of copper/Invar/copper is not overly advantageous in advanced circuit board design.

Another approach to producing a composite with controlled expansion properties and improved thermal conductivity through the sheet is described and claimed in U.S. Pat. No. 4,283,464 (the '464 patent). The '464 patent teaches having a low CTE plate with holes which are filled with a material which is highly thermally conductive such as copper or silver. This patented development has two major problems. Firstly, the surface of plate has a mixture both high and low thermal conduction spots, i.e. the heat removal rate will vary from about 9 W/m °K. on the material of low CTE to about 397 W/m °K. on the copper. Since the smallest practical size of the holes which can be drilled or punched in the sheet of low CTE material is about 1.0 to 1.5 mm, which is a large dimension relative to the size of the components to be mounted thereon, the non-homogeneous heat transfer will result in unacceptable thermally induced strains or temperature gradients in these devices Secondly, the '464 patent alleges use of a KOVAR TM (alloy 42) material with a CTE of around 5 to 6 ppm/°C. to match the CTE of the device to be cooled. However, the author has not realized or has not constructed a device, and measured the CTE of the final devices or he would find, as is proven hereinafter, that the presence of the copper in the holes will exert a high expansion force on the device as it is heated, and the average CTE of the device will be substantially higher than the CTE of the KOVAR (alloy 42) plate. Thus, the device described in U.S. Pat. No. 4,283,464 would not have the properties as described.

OBJECTS AND DRAWINGS

It is an object of the invention to provide a composite material which overcomes all of the deficiencies described previously.

Further objects of the present invention are to provide a highly conductive composite with low thermal expansion properties in which the thermal conduction is relatively isotropic and to provide a practical process for fabrication thereof.

The present invention is described in reference to the drawings in which.

DESCRIPTION OF THE INVENTION

The present invention contemplates a composite sandwich wherein the central member consists of a plate or strip of metal having a CTE in the range of about 5 to 12 ppm/°C. having a plurality of substantially uniformly distributed holes passing through the member. The outer members of the composite are composed of a highly conductive material like copper (thermal conductivity=397 W/m °K.) and the holes in the central member are also filled with the highly conductive material. The whole of the composite is integrally bound together such as by metallurgical bonding attendant hot rolling. The ratio of the outer and central member thicknesses and the volume percentage of filled holes in the central member are controlled so that the capacity for heat flow in the material is approximately the same along the length and breadth of the plate or strip, i.e. the x-y axes and through the strip, i.e. the z axis. The ratio of heat conductance in the x-y direction ($K_{x-y}$) to heat conductance in the z direction ($K_z$) is about 0.9 to 2.0. Further, the ratio of the outer and central member thicknesses and the percentage of holes is maintained such that the required CTE of from about 5 to 12 ppm/°C. is obtained.

The nickel-iron component of the composite material made by the process of the present invention is advantageously Invar, an alloy containing about 36% nickel, balance essentially iron, together with usual amounts of impurities and incidental elements. However, low expansion alloys can be made over the range of about 32 to 40% by weight of nickel, balance iron, and other elements such as cobalt can be substituted for up to about 5% of the nickel. As has been known for a long time, the minimum of CTE exhibited by the 36% nickel, balance iron alloy can be shifted to higher nickel contents when manganese or chromium is present in the alloy and to lower nickel contents when copper or carbon is present in the alloy. Specifically, the present invention contemplates use of any nickel-iron low CTE alloy discussed by M.A. Hunter in the chapter on Low-Expansion Alloys, Metals Handbook, ASM, 8th Edition, Vol. 1, pp. 816-819.

Figure 1:
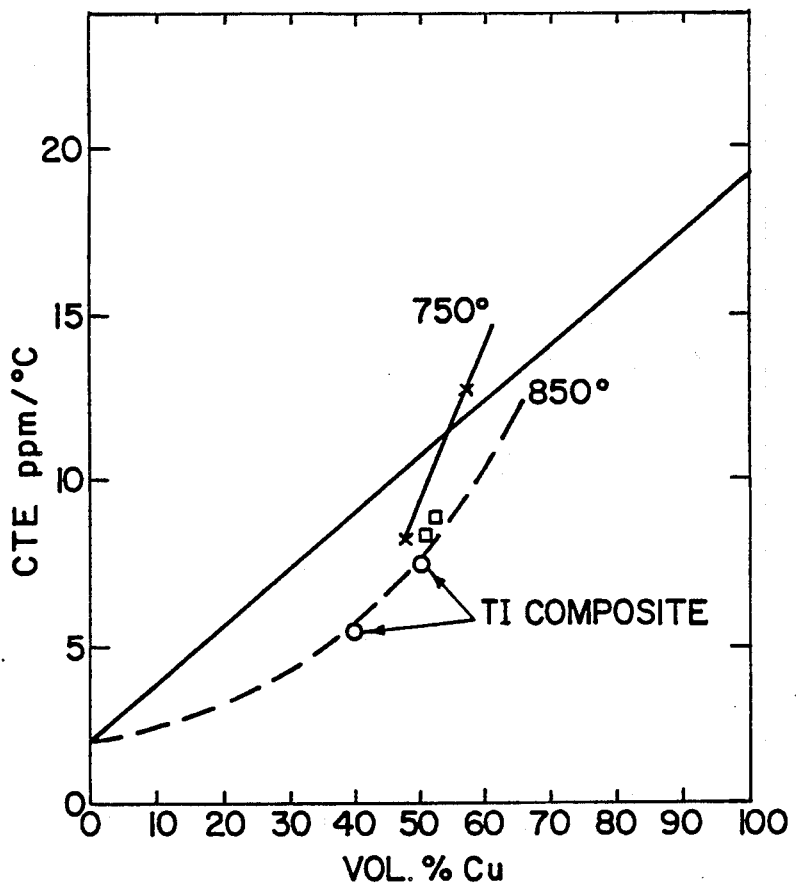
FIG. 1 is a graph interrelating volume percent copper and coefficient of thermal expansion (CTE) for composites of copper and Invar.

The design of composite structures of the present invention starts with the requirement for a structure having a selected CTE within the range of about 5 to 12 ppm/°C. FIG. 1 of the drawing shows the relationship between CTE and volume percent copper in an Invar-copper composite as effected by temperature of the hot rolling employed to make the composite sandwich of the invention. In general, the range of volume percent copper in composites according to the invention is about 35-70 volume percent. Once a value within this range is selected, the relative amounts of metal having a low CTE, e.g. Invar and copper are then established. It remains then to ascertain the ratio of surface lying copper to copper passing through the plate or strip of Invar in order to define the composite of the present invention.

Figure 2:
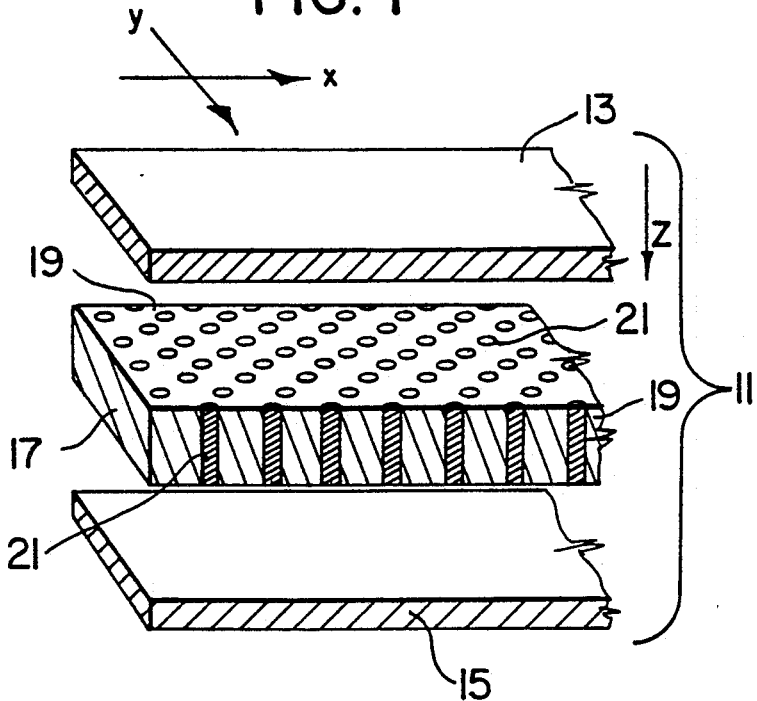
FIG. 2 depicts a composite of the present invention in exploded form.

For the sake of clarity, a composite of the invention is illustrated in FIG. 2 of the drawing in exploded form and considerably exaggerated in proportion. The composite 11 overall comprises top layer of copper 13, bottom copper layer 15 sandwiching copper-Invar (or other low CTE alloy) plate 17. Plate 17 includes nickel-iron alloy matrix 19 and copper inserts 21. Those skilled in the art will appreciate that in actuality the copper layers 13 and 15 are bonded to and integral with the copper of copper inserts 21. Composite 11 is advantageously made by providing a perforated plate or sheet of nickel-iron alloy, sandwiching this sheet between two sheets of copper, raising the temperature of the sandwich to about 700 to about 950° C. and hot rolling the sandwich to provide an integral composite as depicted in FIG. 2. Alternatively, the composite of the invention could be made by electro- or electroless-plating of copper on a perforated plate or sheet of low CTE nickel-iron alloy followed by hot deforming the deposited copper (e.g. by rolling) to completely fill the holes in the perforated plate. It is also possible to provide the required amount of copper by a combination of plated copper and sheet form copper.

EXAMPLES

Invar sheet containing 36% nickel, balance iron, along with the normal commercial impurities was rolled by conventional hot rolling procedures to strips 0.89 mm and 1.27 mm in thickness. The electrical resistivity of this strip was measured at 81 micro ohm cm. The CTE was measured at 2.0 ppm/°C. between 30 and 400° C.

Copper sheet of commercial grade was purchased in thicknesses of 0.38 mm, 0.508 mm and 0.635 mm. The electrical resistivity of this sheet was measured at 1.8 micro ohm cm and the CTE at 18 ppm/°C.

The Invar strip was perforated with 1.59 mm diameter holes on 2.78 mm staggered centers to give a perforated Invar strip with 28% open area in it.

Various combinations of thicknesses of copper and perforated Invar sheets were stacked to make copper-/Invar/copper sandwiches. These sandwiches were placed in a belt furnace operating at either 750° C. or 850° C, in a slightly reducing atmosphere containing 2% $CO + H_2$, produced by partial combustion of natural gas, and having a controlled dew point of 0° C. The residence time in said furnace was 10 minutes. The samples were then rolled at temperature in a hot roll to give a strip of the thickness shown in Table I. The hot rolled sandwich strips were then cold rolled to the final thickness shown and stress relieved for 10 minutes at 550° C. in a 10% $H_2$, balance $N_2$ atmosphere.

TABLE I

| | | | | | Longitudinal | | | Thermal Conductivity | |
|---|---|---|---|---|---|---|---|---|---|
| Original Sheet Thickness Cu/Invar/Cu mm | Hot Rolling Temp. °C. | Vol. % Cu | Cold Rolled from mm to mm(1) | | Resistivity micro ohm cm Measured | Calc. | CTE ppm/°C. | Calculated W/m °K z(2) | x-y(3) |
| 0.51/1.27/0.51* | 750 | 44.1 | 1.04 | 0.94 | 5.5 | 3.6 | 8.3 | 151 | 204 |
| 0.635/1.27/0.635 | 750 | 59.2 | 1.98 | 1.30 | 4.0 | 3.1 | 12.8 | 167 | 267 |
| 0.38/0.89/0.38 | 850 | 56.4 | 1.15 | 0.87 | 4.2 | 3.3 | 8.9 | 159 | 220 |
| 0.51/1.27/0.51 | 850 | 51.3 | 1.56 | 1.10 | 4.2 | 3.4 | 8.5 | 156 | 220 |
| 0.635/0.89/0.635 | 850 | 67.0 | 1.51 | 1.04 | 2.8 | 2.7 | 11.8 | 189 | 267 |

*0.1 mm of Cu ground off one surface.
(1)Annealed 550° C. for 10 min. in 10% $H_2$, bal. $N_2$.
(2)Conductivity through the sheet.
(3)Conductivity along the sheet.

The electrical resistivities of the sandwiches were measured along the strips, i.e. in the plane of the sandwich with the results as shown in Table I.

The strips were cut into lengths and observed by metallographic methods. All of the holes in the Invar strip were completely filled with copper. The copper was integrally bound to the Invar even in the holes. The whole sandwich was flat and free of surface cracks.

Simple calculations were made for each of the strips produced and are shown in Table I. The volume percent copper is shown.

The longitudinal resistivity of the composite strips was calculated by first calculating the final thickness of the copper sheet after allowance for filling the holes in the Invar, then applying known simple standard equations using the previously measured resistivities of 1.8 micro ohm cm for the starting copper and 81 micro ohm cm for the starting Invar sheet.

A comparison of the measured and calculated electrical resistivity as shown in Table I reveals that the composites have the expected value of resistivity and the properties of the copper and Invar have not been markedly altered by the thermal mechanical treatment.

As is well known in the art, thermal conductivities of copper alloys (and most metals) are inversely proportional to the electrical resistivity. Thus, one would expect the more difficult to measure thermal conductivities to also be the same as calculated from the values of 397 W/m °K. for copper and 9.8 W/m °K. for Invar while taking into account the geometry of the composites produced. Calculated values of the thermal conductivity for the composites both in the plane of the composite or through the sheet are shown in Table I. For comparison the CTE values for the Texas Instruments (TI) Cu/Invar/Cu sandwich made with a non-perforated sheet of Invar track the CTE values of the composite of the present invention very well based upon overall volume percent copper. However, the thermal conductivities of the TI composites in the x-y directions are roughly 10 times the thermal conductivities in the z direction. The CTE values of the TI composites are taken from the literature referenced at the start of this patent application. Our calculations show that in the composite as described and defined in U.S. Pat. No. 4,283,464 the CTE is about 15 ppm/°C. rather than 7 ppm/°C. as reported and the thermal conductivity in the "z" direction is about 6 times the thermal conductivity in the "x-y" directions.

CTE data for the composites of the present invention is plotted as a function of volume percent copper in FIG. 1. Note that for the composite construction in the useful range of this invention, the CTE of the composite is a function only of the volume %Cu and the hot rolling temperature. Published data points relative to the CTE's of Texas Instruments composites fall on the same line as data points relative to composites of this invention hot rolled at 850° C. The difference in CTE between 750° C. hot rolling and 850° C. hot rolling is greater at greater percentages of copper because when the composite is rolled at the higher temperature the copper exerts a higher compressive force on the Invar as it cools.

From the foregoing it is to be observed that the present invention contemplates useful Cu/Invar/Cu composites hithertofore not constructed in which Invar sheet (36% Ni, bal. Fe) is perforated with small holes (0.79 to 1.59 mm in diameter) such that from about 15 to 40% of the volume of the Invar sheet is holes. The Invar sheet is then surrounded on each side by pure copper sheets. The thicknesses of the copper and Invar sheets are selected to provide volume percent of copper of from 20 to 60% and such that the thermal conductivity of the finished composite will be roughly isotropic. The three sheets of Cu/Invar/Cu are then heated from about 750 to about 900° C. (preferably 850° C.) in a reducing atmosphere then hot rolled. The rolling at temperature in the reducing atmosphere is highly preferred to ensure that the copper completely fills every hole and is integrally bonded to itself and to the Invar even on the sides of the punched holes. The resulting composite can be subsequently cold rolled to the final thickness desired.

A more accurate calculation of the thermal conductivities is exemplified as follows:

Assume one starts with two Cu sheets, each 0.51 mm thick and one Invar sheet 1.27 mm thick with 28% holes through it. As the hot rolling proceeds Cu is first squeezed into the holes in the Invar from each side. When the holes are filled the copper, the thickness of the copper will be $0.51 - (1.27 \times 0.28/2) = 0.332$ mm on each side of the Invar. Subsequent more severe rolling will elongate both the copper and Invar together as one piece. The volume percent copper is $$\frac{0.51 \times 2}{(0.51 \times 2) + (1.27 \times 0.72)} \times 100 = 52.6\%$$

The thermal conductivity of the composite is calculated in two steps using standard heat transfer equations. First the central Invar plate with 28% copper in holes through the sheet has:

$$\begin{aligned} K_z &= K_{Cu} \times .28 + K_{Invar} \times .72 \\ &= 397 \times .28 + 9.8 \times .72 \\ &= 118.2 \ W/m \ °K. \end{aligned}$$

and $$K_{x-y} \ Invar \ Cu \ Plate = \frac{1}{\frac{.28}{397} + \frac{.72}{9.8}} = 13.5 \ W/m \ °K.$$

where z refers to the heat conductivity through the plate and x-y refers to the conductivity along the plate.

Secondly, the conductivity of central Invar-Cu plate is then used to calculate the overall conductivity of the composite.

$$\begin{aligned} K_{z \ comp} &= \frac{1}{\frac{\text{fraction Cu sheet}}{K_{Cu}} + \frac{\text{fraction Invar-Cu}}{K_z \ Invar \ Cu \ plate}} \\ &= \frac{1}{\frac{2 \times 0.332}{\frac{1.93}{397}} + \frac{\frac{1.27}{1.93}}{118.2}} = 155.6 \ W/m \ °K. \end{aligned}$$

$$K_{x-y \ comp} = \frac{2 \times 0.332}{1.93} \times 397 + \frac{1.27}{1.93} \times 118.2 = 214.4 \ W/m \ °K.$$

While the foregoing calculation does not take into account interfacial barriers to thermal conductivity and is valid only in the temperature range in which the values of $K_{Cu}$ and $K_{Invar}$ are reasonable, it is believed that this calculation reasonably predicts the thermal conductivities of the composites of the present invention.

Figure 3:
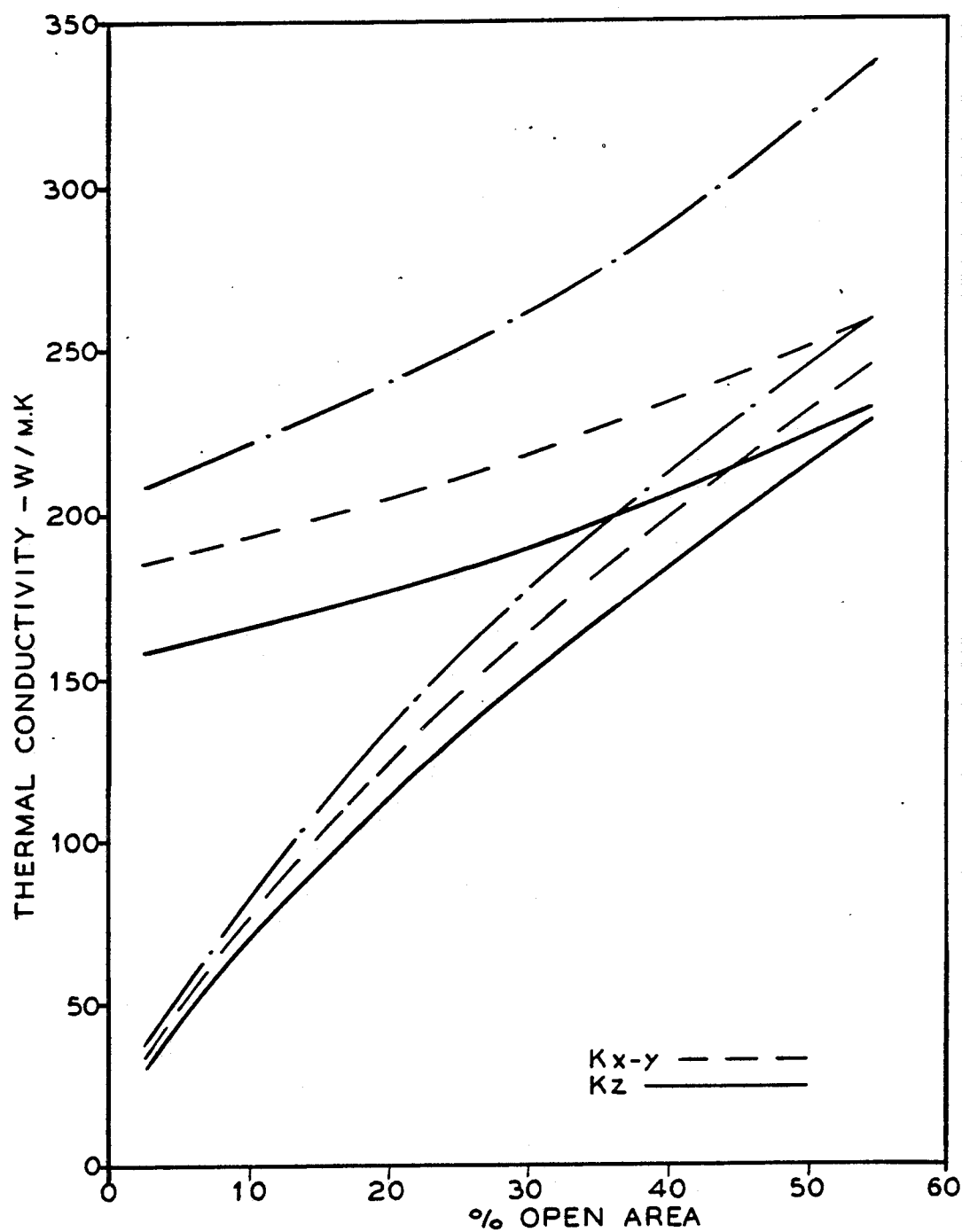
FIG. 3 is a graph interrelating (1) thermal conductivity of the composite of the invention in x-y directions and (2) thermal conductivity in the z direction with volume percent of copper-filled passages through an inner Invar plate of a copper-Invar-copper sandwich structure.

An example of how these calculations can be used for design purposes is presented in FIG. 3 which shows the effect of Invar perforation on the conductivities both in the x-y ($K_{x-y}$) directions and the z direction ($K_z$) for three different copper-Invar combinations. Similar curves for any other copper-low-expansivity-alloy-copper combination could be plotted for both electrical and thermal conductivity. Curves A, B and C show the relationship between thermal conductivity in the z direction and the volume percentage of copper-filled through passages in inner copper-Invar plate 17. Curves A', B' and C' show the corresponding relationship with respect to thermal conductivity in the x-y directions.

Those skilled in the art will appreciate that while the present invention has been described using copper as the metal of excellent heat and electrical conductivity, copper can be replaced by gold or silver if the usage demands these more costly metals. Gold and silver behave approximately the same as copper with respect to hot rolling. If for some reason one would wish to use aluminum as the metal of good electrical and heat conductivity, hot rolling would have to be conducted at temperatures below about 625° C. and interfacial effects due to oxide films would have to be tolerated.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

The embodiments of the invention in which an exclusive property or privilege is claimed are defined as follows:

1. A composite structure having a linear thermal coefficient of expansion of about 5 to 12 ppm/°C. and comprising a thin metallic body extended in at least one of width or length comprising two outer layers of metal of high electrical and heat conductivity sandwiching a thin, coextensive inner layer of low coefficient of thermal expansion metal, said inner layer having a multiplicity of essentially uniformly distributed paths of said metal of high electrical and heat conductivity extending therethrough and connected to and integral with said two outer layers of said metal of high electrical and heat conductivity, said composite structure being so constructed and arranged that
   (A) the paths of said metal of high electrical and heat conductivity through said inner layer comprise about 15 to 40 volume percent of said inner layer;
   (B) the thicknesses of said outer layers of said metal of high electrical and heat conductivity (K) being controlled to provide thermal and electrical conductivity along said length and breadth (x—y) of said composite related to said conductivities across the thickness of (z) said composite such that $$\frac{K_{x-y}}{K_z} = 0.9 \text{ to } 2.0 \text{ and}$$

(C) the overall volume fraction of said metal of high electrical and heat conductivity in said composite is such to provide a linear coefficient of thermal expansion within the aforesaid range, 2. A composite structure as in claim 1 wherein said metal of high electrical and heat conductivity is copper.

3. A composite structure as in claim 2 in which copper paths in said inner layer comprise about 30 volume of said inner layer.

4. A composite structure as in claim 1 in which the metal of low coefficient of thermal expansion comprises an alloy having about 36 wt.% nickel and the balance iron.

* * * * *